US011430885B2

(12) United States Patent
Nishiguchi

(10) Patent No.: US 11,430,885 B2
(45) Date of Patent: Aug. 30, 2022

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Toshifumi Nishiguchi, Hakusan Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

(*) Notice: Subject to any disclaimer, the term of this patent is extended or adjusted under 35 U.S.C. 154(b) by 0 days.

(21) Appl. No.: 17/197,127

(22) Filed: Mar. 10, 2021

(65) Prior Publication Data

US 2022/0093788 A1 Mar. 24, 2022

(30) Foreign Application Priority Data

Sep. 18, 2020 (JP) ............................ JP2020-157486

(51) Int. Cl.
*H01L 29/78* (2006.01)
*H01L 29/66* (2006.01)
(Continued)

(52) U.S. Cl.
CPC ...... *H01L 29/7813* (2013.01); *H01L 29/0869* (2013.01); *H01L 29/1095* (2013.01);
(Continued)

(58) Field of Classification Search
CPC ............ H01L 29/7813; H01L 29/0869; H01L 29/1095; H01L 29/41741; H01L 29/4236;
(Continued)

(56) References Cited

U.S. PATENT DOCUMENTS 7,943,990 B2 * 5/2011 Ma .................... H01L 29/7811 257/330
10,243,067 B2 3/2019 Konishi et al.
(Continued)

FOREIGN PATENT DOCUMENTS

JP 2009-43966 A 2/2009
JP 4839599 B2 12/2011
(Continued)

*Primary Examiner* — Igwe U Anya
(74) *Attorney, Agent, or Firm* — Allen & Overy LLP

(57) ABSTRACT

According to one embodiment, a semiconductor device includes a first electrode, first and third semiconductor regions of a first conductivity type, second and fourth semiconductor regions of a second conductivity type, a gate electrode and a second electrode. The third semiconductor region is disposed on one portion of the second semiconductor region. The fourth semiconductor region is disposed on another portion of the second semiconductor region, is positioned below the third semiconductor region. The second electrode includes first and second portions separated from each other and allowing the fourth semiconductor region to be positioned therebetween, and the third portion disposed on the first and second portions and arranged with the third semiconductor region. The first, second, and third portions are in contact with the fourth semiconductor region.

8 Claims, 10 Drawing Sheets

(51) Int. Cl.
*H01L 29/417* (2006.01)
*H01L 29/10* (2006.01)
*H01L 29/423* (2006.01)
*H01L 29/08* (2006.01)
*H01L 29/739* (2006.01)

(52) U.S. Cl.
CPC .... *H01L 29/41741* (2013.01); *H01L 29/4236* (2013.01); *H01L 29/66348* (2013.01); *H01L 29/66734* (2013.01); *H01L 29/7397* (2013.01)

(58) Field of Classification Search
CPC ......... H01L 29/66348; H01L 29/66734; H01L 29/7397
USPC .......................................................... 257/330
See application file for complete search history.

(56) References Cited

U.S. PATENT DOCUMENTS

| | | | | |
|---|---|---|---|---|
| 10,453,957 | B2 | 10/2019 | Kobayashi et al. | |
| 2015/0255586 | A1 | 9/2015 | Naijo | |
| 2018/0025910 | A1* | 1/2018 | Ohashi | H01L 29/66068 257/77 |
| 2018/0083137 | A1 | 3/2018 | Kobayashi et al. | |
| 2019/0088778 | A1* | 3/2019 | Kawamura | H01L 29/1095 |
| 2021/0020776 | A1* | 1/2021 | Hsieh | H01L 29/7813 |
| 2021/0296456 | A1* | 9/2021 | Aida | H01L 29/41741 |

FOREIGN PATENT DOCUMENTS

| | | | |
|---|---|---|---|
| JP | 2015-167185 | A | 9/2015 |
| JP | 6226786 | B2 | 11/2017 |
| JP | 2018-46256 | A | 3/2018 |
| JP | 6639365 | B2 | 2/2020 |

* cited by examiner

SEMICONDUCTOR DEVICE

CROSS-REFERENCE TO RELATED APPLICATIONS

This application is based upon and claims the benefit of priority from Japanese Patent Application No. 2020-157486, filed on Sep. 18, 2020; the entire contents of which are incorporated herein by reference.

FIELD

Embodiments described herein relate generally to a semiconductor device.

BACKGROUND

Semiconductor devices such as Metal-Oxide-Semiconductor Field Effect Transistor (MOSFET) and Insulated Gate Bipolar Transistor (IGBT) are used in applications such as power conversion. It is desirable that such semiconductor devices exhibit improved avalanche ruggedness.

DETAILED DESCRIPTION

Figure 1:
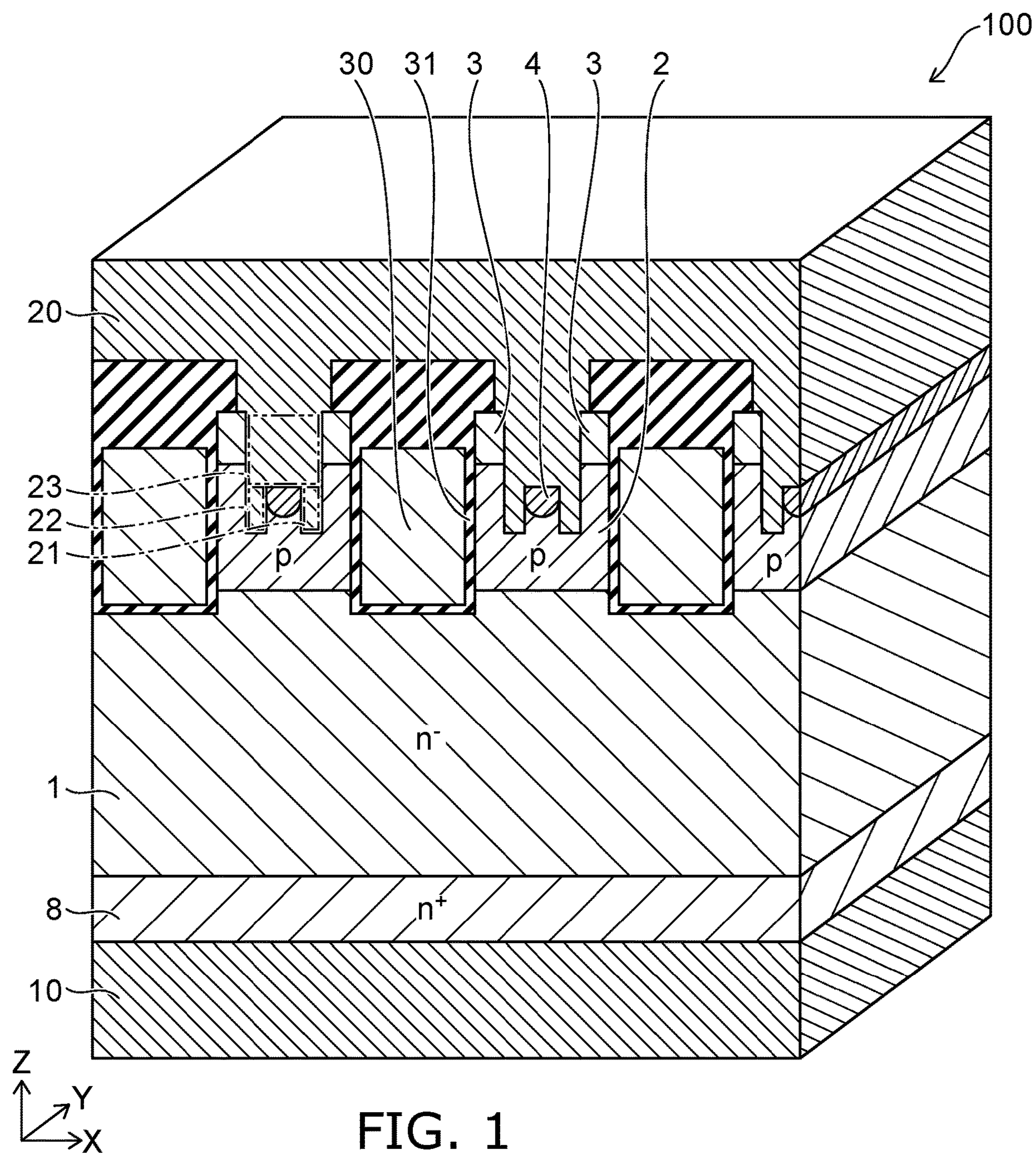
FIG. 1 is a perspective cross-sectional view illustrating a semiconductor device according to a first embodiment.

According to one embodiment, a semiconductor device includes a first electrode, a first semiconductor region, a second semiconductor region, a third semiconductor region, a fourth semiconductor region, a gate electrode, and a second electrode. The first semiconductor region is disposed on the first electrode, and is electrically connected to the first electrode. The first semiconductor region is of a first conductivity type. The second semiconductor region is disposed on the first semiconductor region. The second semiconductor region is of a second conductivity type. The third semiconductor region is disposed on one portion of the second semiconductor region. The third semiconductor region is of the first conductivity type. The fourth semiconductor region is disposed on another portion of the second semiconductor region. The fourth semiconductor region is of the second conductivity type. The fourth semiconductor region is positioned below the third semiconductor region. A concentration of a second conductivity type impurity in the fourth semiconductor region being higher than a concentration of the second conductivity type impurity in the second semiconductor region. The gate electrode is arranged, in a second direction perpendicular to a first direction, via a gate insulating layer, with one portion of the first semiconductor region, the second semiconductor region, and one portion of the third semiconductor region. The first direction is from the first semiconductor region to the second semiconductor region. The second electrode is disposed on the gate electrode, the third semiconductor region, and the fourth semiconductor region. The second electrode is electrically connected to the third semiconductor region and the fourth semiconductor region. The second electrode includes a first portion, a second portion, and a third portion. The first portion and the second portion are separated from each other in the second direction. The first portion and the second portion allow the fourth semiconductor region to be positioned therebetween. The third portion is disposed on the first portion and the second portion. The third portion is arranged in the second direction with the third semiconductor region. The first portion, the second portion, and the third portion are in contact with the fourth semiconductor region.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

In the below description and the drawings, the indications of $n^+$, n, $n^-$, $p^+$, and p represent relative levels of concentrations of impurities. That is, an indication added with "+" represents that it is relatively higher in concentration of impurity than an indication added with neither "+" nor "−", meanwhile an indication added with "−" represents that it is relatively lower in concentration of impurity than an indication added with neither "+" nor "−". These indications represent, when each region contains a p-type impurity and an n-type impurity, a relative level of a net concentration of impurity after the impurities are compensated with each other.

For the embodiments described below, each embodiment may be implemented in such a manner that p-type and n-type may be inverted in each semiconductor region.

First Embodiment

FIG. 1 is a perspective cross-sectional view illustrating a semiconductor device according to a first embodiment.

A semiconductor device 100 according to the first embodiment is a MOSFET. The semiconductor device 100 includes an $n^-$-type (first conductivity type) drift region 1 (first semiconductor region), a p-type (second conductivity type) base region 2 (second semiconductor region), an $n^+$-type semiconductor region 3 (third semiconductor region), a $p^+$-type contact region 4 (fourth semiconductor region), an $n^+$-type drain region 8, a lower electrode 10 (first electrode), an upper electrode 20 (second electrode), and a gate electrode 30.

The description of the embodiments uses an XYZ orthogonal coordinate system. A direction from the $n^-$-type drift region 1 to the p-type base region 2 is Z-direction (first direction). Two directions that are perpendicular to Z-direction, and which are orthogonal to each other are X-direction (second direction) and Y-direction (third direction). Moreover, for the purpose of description, the direction from the $n^-$-type drift region 1 to the p-type base region 2 is called "upper", and its opposite direction is called "lower". These directions are based on a relative positional relationship between the $n^-$-type drift region 1 and the p-type base region 2, and has no relation to the direction of gravity.

The lower electrode 10 is disposed at a lower surface of the semiconductor device 100. The $n^+$-type drain region 8 is disposed on the lower electrode 10, and is electrically connected to the lower electrode 10. The $n^-$-type drift region 1 is disposed on the $n^+$-type drain region 8. The $n^-$-type drift region 1 is electrically connected to the lower electrode 10 via the $n^+$-type drain region 8. A concentration of an n-type impurity contained in the $n^-$-type drift region 1 is lower than a concentration of the n-type impurity contained in the $n^+$-type drain region 8.

The p-type base region 2 is disposed on the $n^-$-type drift region 1. The $n^+$-type semiconductor region 3 is disposed on one portion of the p-type base region 2. The $p^+$-type contact region 4 is disposed on another portion of the p-type base region 2. The $p^+$-type contact region 4 is positioned lower than the $n^+$-type semiconductor region 3. A concentration of a p-type impurity contained in the $p^+$-type contact region 4 is higher than a concentration of the p-type impurity contained in the p-type base region 2. The gate electrode 30 is arranged in X-direction with one portion of the $n^-$-type drift region 1, the p-type base region 2, and one portion of the $n^+$-type semiconductor region 3, via a gate insulating layer 31.

The upper electrode 20 is disposed on the $n^+$-type semiconductor region 3, the $p^+$-type contact region 4, and the gate electrode 30, and is electrically connected to the $n^+$-type semiconductor region 3 and the $p^+$-type contact region 4. The p-type base region 2 is electrically connected to the upper electrode 20 via the $p^+$-type contact region 4. The upper electrode 20 is electrically separated from the gate electrode 30.

Figure 2:
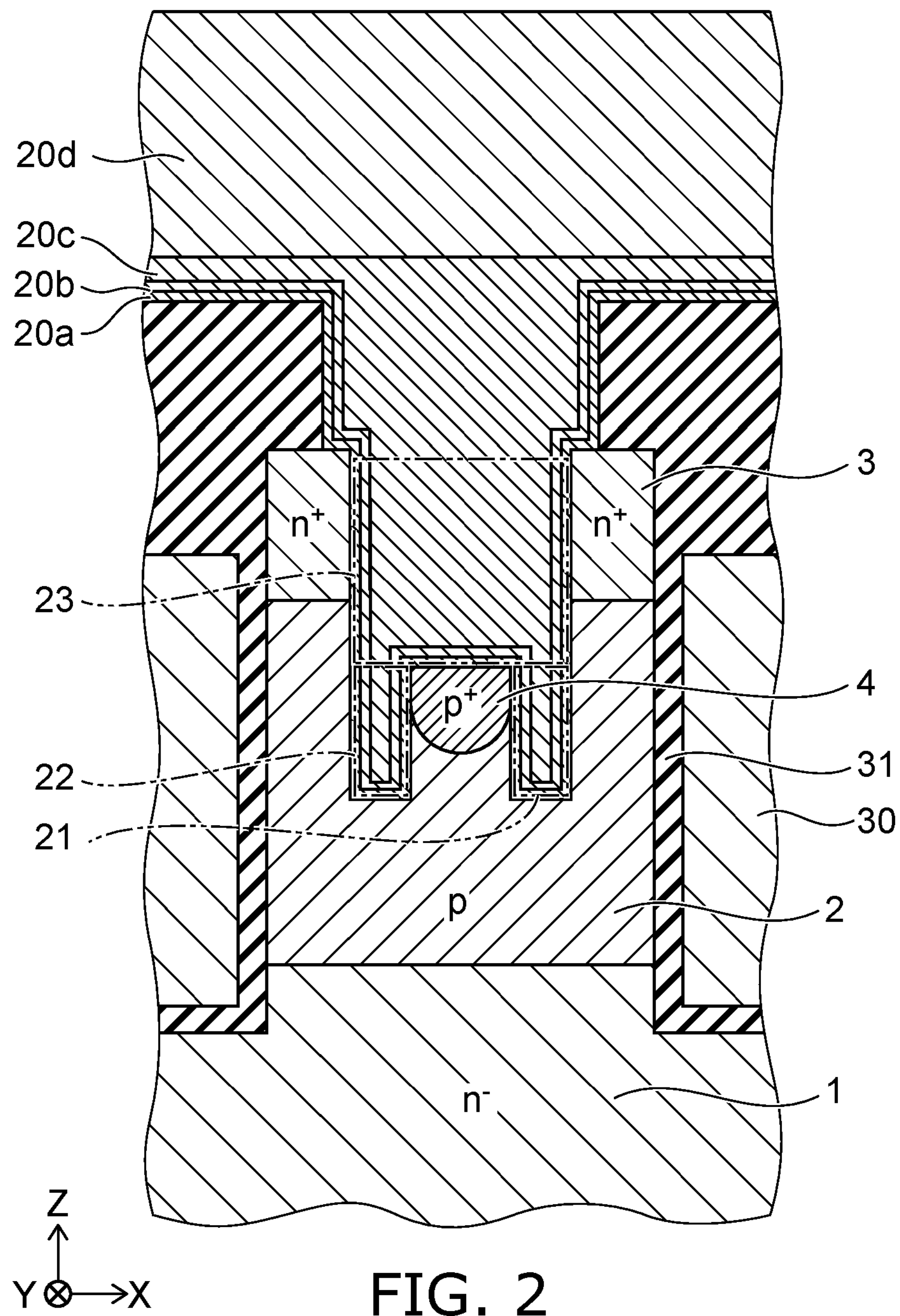
FIG. 2 is an enlarged cross-sectional view of one portion of the semiconductor device according to the first embodiment.

FIG. 2 is an enlarged cross-sectional view of one portion of the semiconductor device according to the first embodiment.

As illustrated in FIGS. 1 and 2, the upper electrode 20 includes a first portion 21, a second portion 22, and a third portion 23.

The first portion 21 and the second portion 22 are positioned lower than the $n^+$-type semiconductor region 3, and are separated from each other in X-direction. The $p^+$-type contact region 4 is positioned between the first portion 21 and the second portion 22. The first portion 21 and the second portion 22 are each separated in X-direction from the gate insulating layer 31. The third portion 23 is disposed on the $p^+$-type contact region 4, the first portion 21, and the second portion 22. The third portion 23 is arranged in X-direction with the $n^+$-type semiconductor region 3. The $p^+$-type contact region 4 is in contact with the first portion 21, the second portion 22, and the third portion 23.

A lower end of the first portion 21 and a lower end of the second portion 22 are separated in Z-direction from the $n^-$-type drift region 1. The lower end of the first portion 21 and the lower end of the second portion 22 are positioned lower than a lower end of the $p^+$-type contact region 4, and are in contact with the p-type base region 2. For example, a length in X-direction of the first portion 21 is shorter than a length in Z-direction of the first portion 21. A length in X-direction of the second portion 22 is shorter than a length in Z-direction of the second portion 22.

For example, the p-type base regions 2, the $n^+$-type semiconductor regions 3, the $p^+$-type contact regions 4, the first portions 21, the second portions 22, the third portions 23, and the gate electrodes 30 are respectively disposed in plural in X-direction. A pair of the $n^+$-type semiconductor regions 3 that are separated from each other in X-direction are disposed on each of the p-type base regions 2. The third portion 23 is positioned between the pair of the $n^+$-type semiconductor regions 3. The p-type base regions 2, the $n^+$-type semiconductor regions 3, the $p^+$-type contact regions 4, the first portions 21, the second portions 22, the third portions 23, and the gate electrodes 30 each extend in Y-direction.

Operations of the semiconductor device 100 will be described.

In a state where a positive voltage with respect to the upper electrode 20 is applied to the lower electrode 10, a voltage above a threshold is applied to the gate electrode 30. The p-type base region 2 is then formed with a channel (inversion layer). Electrons flow, via the channel and the $n^-$-type drift region 1, to the lower electrode 10. Therefore, the semiconductor device 100 becomes an on state. After that, as the voltage applied to the gate electrode 30 lowers below the threshold, the channel in the p-type base region 2 disappears, causing the semiconductor device 100 to become an off state.

As the semiconductor device 100 switches from the on state to the off state, an electric field intensity increases in the $n^-$-type drift region 1, possibly temporarily leading to an avalanche breakdown. As the avalanche breakdown occurs, many holes and electrons appear. The electrons are discharged to the lower electrode 10, meanwhile the holes are discharged, via the p-type base region 2 and the $p^+$-type contact region 4, to the upper electrode 20.

Example materials of the constituent elements of the semiconductor device 100 will be described.

The $n^-$-type drift region 1, the p-type base region 2, the $n^+$-type semiconductor region 3, the $p^+$-type contact region 4, and the $n^+$-type drain region 8 each contain, as a semiconductor material, silicon, silicon carbide, gallium nitride, or gallium arsenide. When silicon is used as the semiconductor material, it is possible to use arsenic, phosphorus, or antimony, as the n-type impurity. It is possible to use boron, as the p-type impurity. The gate electrode 30 contains a conductive material such as polysilicon. The gate insulating layer 31 contains an insulating material such as silicon oxide. The lower electrode 10 and the upper electrode 20 each contain metal such as titanium, tungsten, or aluminum.

As illustrated in FIG. 2, the upper electrode 20 may include a plurality of metal layers **20*a* to 20*d*. The metal layer 20*a* contains titanium. The metal layer 20*b* contains titanium nitride. The metal layer 20*c* contains tungsten. The metal layer 20*d* contains aluminum. The metal layer 20*a* is disposed along surfaces of the p-type base region 2, the $n^+$-type semiconductor region 3, and the $p^+$-type contact region 4. On the metal layer 20*a*, the metal layer 20*b* is disposed along the metal layer 20*a*. The metal layer 20*c* is disposed on the metal layer 20*b* to fill a gap between the $n^+$-type semiconductor regions 3. The metal layer 20*d* is disposed on the metal layer 20***c*. The first portion 21, the second portion 22, and the third portion 23 include respective portions of the metal layers 20*a* to 20*c*.

FIGS. 3A and 3B, 4A and 4B, and 5A and 5B are cross-sectional views illustrating a method of manufacturing the semiconductor device according to the first embodiment.

One example method of manufacturing the semiconductor device 100 according to the embodiment will be described. A substrate Sub including an $n^+$-type semiconductor layer 8*a* and an $n^-$-type semiconductor layer 1*a* is first prepared. The $n^-$-type semiconductor layer 1*a* is disposed on the $n^+$-type semiconductor layer 8*a*. The p-type impurity is ion-implanted on an upper surface of the substrate Sub to form a p-type semiconductor region 2*a*. Reactive ion etching (RIE) is used to form openings OP1 on the upper surface of the substrate Sub. The openings OP1 are formed in plural in X-direction. The openings OP1 each extend in Y-direction. The openings OP1 are respectively arranged in X-direction with portions of the $n^-$-type semiconductor layer 1*a* and the p-type semiconductor region 2*a*.

Figure 3A:
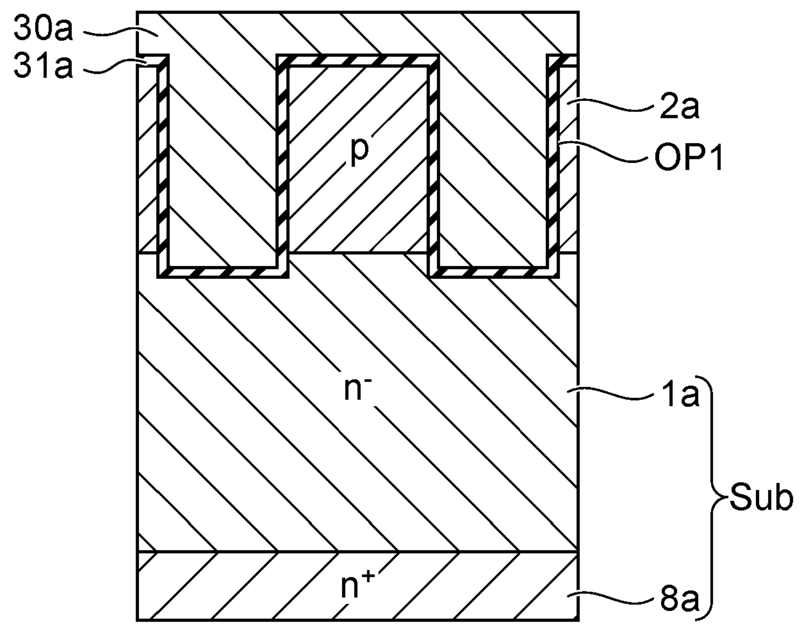
FIGS. 3A and 3B are cross-sectional views illustrating a method of manufacturing the semiconductor device according to the first embodiment.

The substrate Sub is allowed to undergo thermal oxidation to form an insulating layer 31*a*. The insulating layer 31*a* is formed along inner surfaces of the openings OP1 and an upper surface of the p-type semiconductor region 2*a*, respectively. As illustrated in FIG. 3A, chemical vapor deposition (CVD) is used to form, on the insulating layer 31*a*, a conductive layer 30*a* filling the plurality of openings OP1. The conductive layer 30*a* contains polysilicon.

Figure 3B:
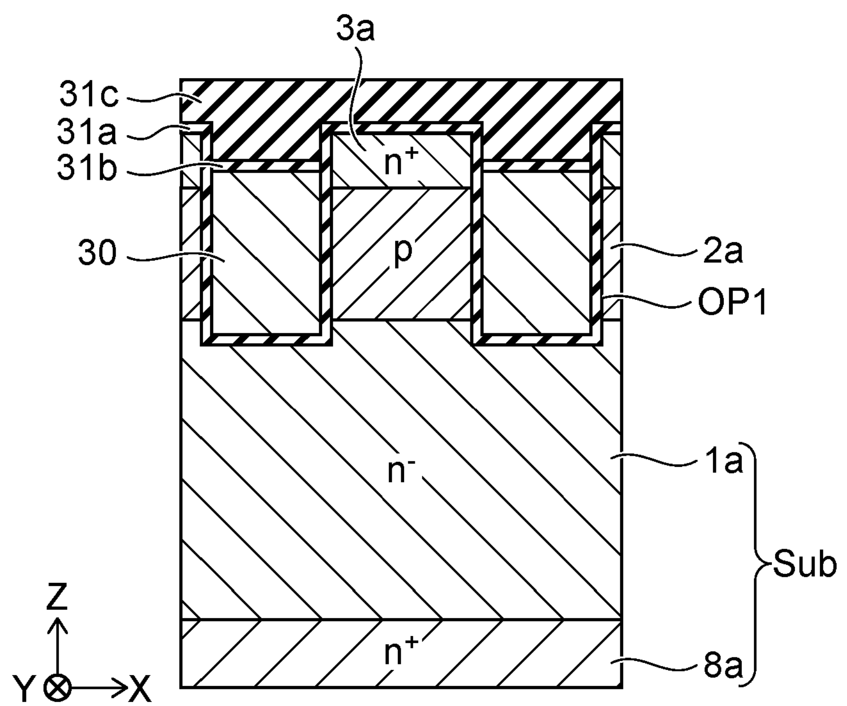

Wet etching or chemical dry etching (CDE) is used to allow an upper surface of the conductive layer 30*a* to lower back until the upper surface of the conductive layer 30*a* is positioned lower than the upper surface of the p-type semiconductor region 2*a*, respectively. Therefore, the conductive layer 30*a* is divided into a plurality of pieces to form the gate electrodes 30 in the openings OP1, respectively. Under thermal oxidation, insulating layers 31*b* are respectively formed on upper surfaces of the gate electrodes 30. The upper surface of the p-type semiconductor region 2*a* is allowed to undergo ion implantation with the n-type impurity to form $n^+$-type semiconductor regions 3*a*. As illustrated in FIG. 3B, CVD is used to form, on the insulating layers 31*a* and 31*b*, an insulating layer 31*c* filling the plurality of openings OP1. The insulating layer 31*c* contains silicon oxide.

Figure 4A:
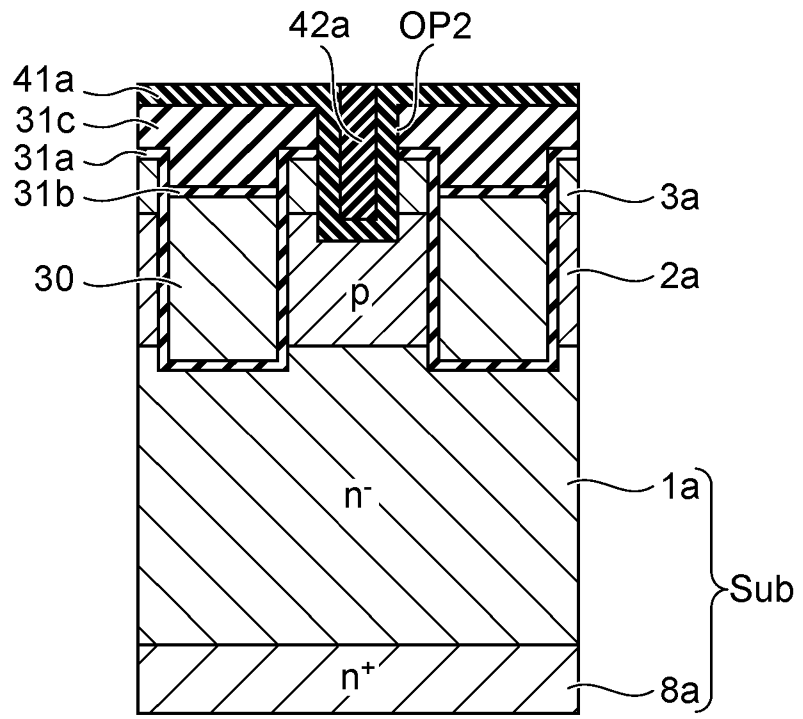
FIGS. 4A and 4B are cross-sectional views illustrating the method of manufacturing the semiconductor device according to the first embodiment.

RIE is used to remove respective portions of the insulating layer 31*c*, the insulating layer 31*a*, the $n^+$-type semiconductor regions 3*a*, and the p-type semiconductor regions 2*a* to form openings OP2. CVD is used to form an insulating layer 41*a* along inner surfaces of the openings OP2 and an upper surface of the insulating layer 31*c*. The insulating layer 41*a* contains silicon nitride. CVD is used to form, as illustrated in FIG. 4A, insulating layers 42*a* in the openings OP2. The insulating layers 42*a* contain silicon oxide.

Figure 4B:
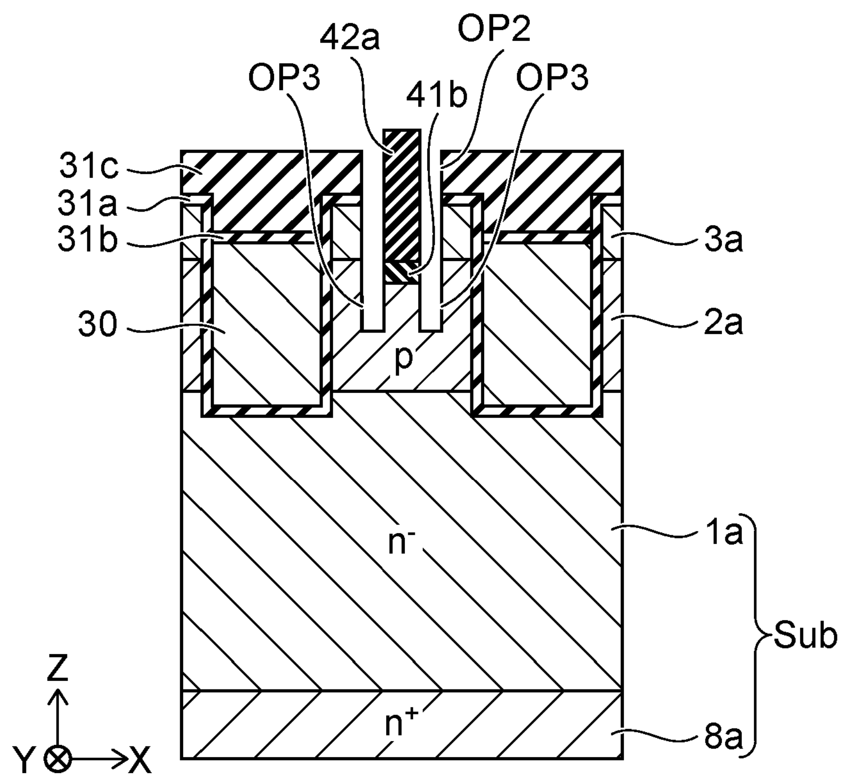

Wet etching is used to remove portions of the insulating layer 41*a* formed along side surfaces of the openings OP2. Therefore, insulating layers 41*b* and the insulating layers 42*a* remain on portions of the p-type semiconductor region 2*a*. The insulating layers 41*b* and 42*a* are used as masks. RIE is then used to remove other portions of the p-type semiconductor region 2*a*. Therefore, as illustrated in FIG. 4B, pairs of openings OP3 are respectively formed on bottom portions of the openings OP2.

Figure 5A:
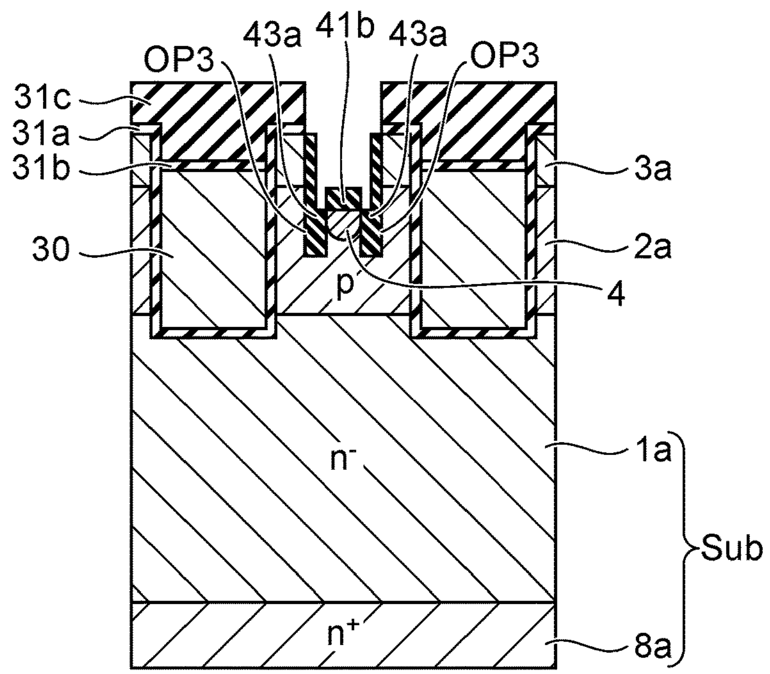
FIGS. 5A and 5B are cross-sectional views illustrating the method of manufacturing the semiconductor device according to the first embodiment.

The insulating layers 42*a* are removed. Under thermal oxidation, insulating layers 43*a* are respectively formed in the openings OP3. As illustrated in FIG. 5A, the p-type semiconductor region 2*a*, between the insulating layers 43*a*, is allowed to undergo ion implantation with the p-type impurity to form the $p^+$-type contact regions 4.

Figure 5B:
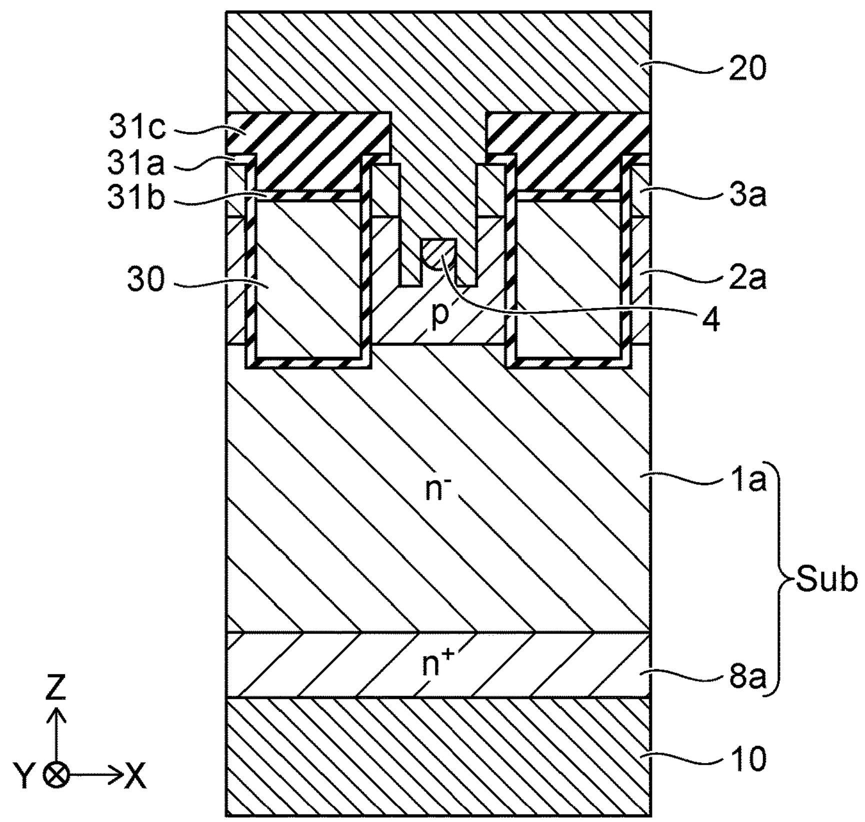

Wet etching is used to remove the insulating layers 41*b* and 43*a*. The upper electrode 20 is formed to fill the openings OP2 and the openings OP3. When the insulating layers 41*b* and 43*a* are to be removed, a side surface of the insulating layer 31*a* and a side surface of the insulating layer 31*c* may be allowed to move back in X-direction. Therefore, it is possible to expand a contact area between the $n^+$-type semiconductor region 3*a* and the upper electrode 20. As illustrated in FIG. 2, the plurality of metal layers 20*a* to 20*d* may be formed as the upper electrode 20. For example, CVD is used to form the metal layers 20*a* to 20*c*. Sputtering is used to form the metal layer 20*d*. A rear surface of the $n^+$-type semiconductor layer 8*a* is polished until the $n^+$-type semiconductor layer 8*a* has a predetermined thickness. As illustrated in FIG. 5B, the lower electrode 10 is formed to the rear surface of the $n^+$-type semiconductor layer 8*a*. As described above, the semiconductor device 100 according to the first embodiment is manufactured.

Effects of the first embodiment will be described.

The semiconductor device 100 includes an npn parasitic bipolar transistor (hereinafter referred to as a parasitic transistor) including the $n^-$-type drift region 1, the p-type base region 2, and the $n^+$-type semiconductor region 3. As described above, when an avalanche breakdown occurs, holes are discharged via the p-type base region 2 and the $p^+$-type contact region 4. At this time, as electrical resistance against holes lowers, it is possible to further suppress a voltage drop even as the holes flow. As a voltage drop is suppressed, it is possible to suppress a potential in the p-type base region 2 from rising, and to suppress the parasitic transistor from operating.

In the semiconductor device 100, the upper electrode 20 includes the first portion 21 to the third portion 23. The $p^+$-type contact region 4 is in contact with the first portion 21 to the third portion 23. Therefore, compared with a case where the upper electrode 20 does not include the first portion 21 and the second portion 22, it is possible to expand a contact area between the $p^+$-type contact region 4 and the upper electrode 20. As the contact area expands, routes along which holes are discharged to the upper electrode 20 increase in number, lowering the electrical resistance against holes. As a result, it is possible to suppress the parasitic transistor from operating. That is, it is possible to improve the avalanche ruggedness of the semiconductor device 100.

The $p^+$-type contact regions 4 are formed, as illustrated in FIGS. 4B and 5A, when the insulating layers 43*a* are first formed in the openings OP3 for providing the first portions 21 and the second portions 22, and, after that, the p-type impurity is ion implanted between the insulating layers 43*a*. Even when the p-type impurity is activated, the insulating layers 43*a* suppress the p-type impurity from diffusing in X-direction. For example, even when differences occur in positions of the openings OP3, it is possible to suppress the p-type impurity from diffusing to a position adjacent to the gate insulating layer 31. Therefore, it is possible to suppress a threshold voltage from varying per the semiconductor device 100, making the semiconductor device 100 more reliable.

For example, the length in X-direction of each of the first portion 21 and the second portion 22 is shorter than a length in X-direction of the $p^+$-type contact region 4. Therefore, it is possible to further expand the contact areas between the $p^+$-type contact region 4 and the first portion 21 to the third portion 23, reducing the electrical resistance against holes.

In light of improved avalanche ruggedness and easy processing, it is desirable that a ratio of the length in Z-direction of the first portion 21 with respect to the length in X-direction of the first portion 21 be greater than 1 and smaller than 20. It is desirable that a ratio of the length in Z-direction of the second portion 22 with respect to the length in X-direction of the second portion 22 be greater than 1 and smaller than 20.

(First Modification)

Figure 6:
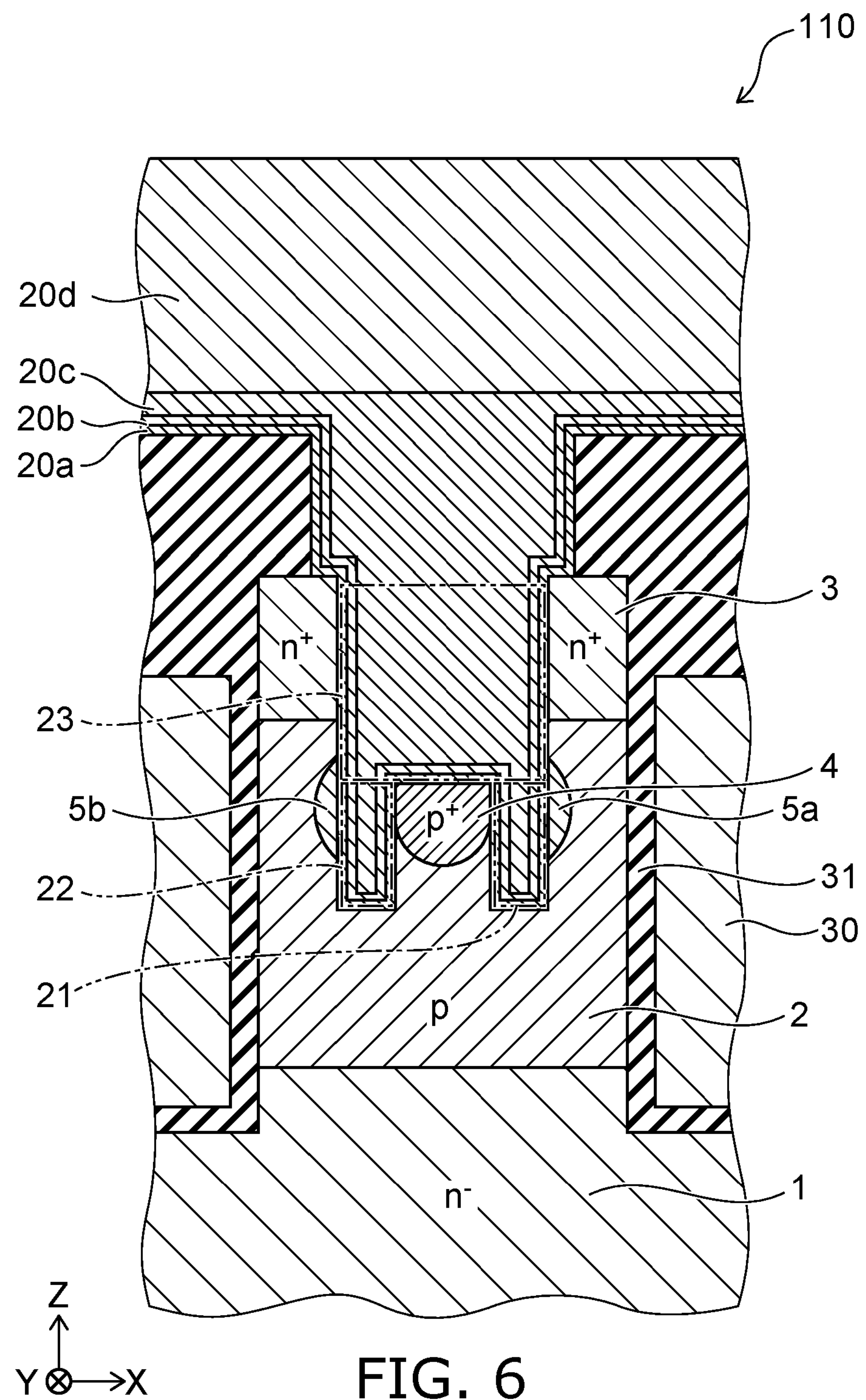
FIG. 6 is a cross-sectional view illustrating one portion of a semiconductor device according to a first modification to the first embodiment.

FIG. 6 is a cross-sectional view illustrating one portion of a semiconductor device according to a first modification to the first embodiment.

A semiconductor device 110 illustrated in FIG. 6 further includes, compared with the semiconductor device 100, a $p^+$-type contact region 5_a_ (fifth semiconductor region) and a $p^+$-type contact region 5_b_.

The $p^+$-type contact region 4, the first portion 21, and the second portion 22 are disposed in X-direction between the $p^+$-type contact regions 5_a_ and 5_b_. The first portion 21 is disposed in X-direction between the $p^+$-type contact regions 4 and 5_a_. The second portion 22 is disposed in X-direction between the $p^+$-type contact regions 4 and 5_b_. The $p^+$-type contact regions 5_a_ and 5_b_ are respectively in contact with the first portion 21 and the second portion 22, and are separated from the gate insulating layer 31.

In a case where the $p^+$-type contact regions 5_a_ and 5_b_ are disposed, holes flowed to the p-type base region 2 when an avalanche breakdown occurs are discharged, via the $p^+$-type contact regions 4, 5_a_, and 5_b_, to the upper electrode 20. The $p^+$-type contact regions 5_a_ and 5_b_ being disposed make it possible to increase in number routes along which the holes are discharged to the upper electrode 20, further reducing the electrical resistance against holes.

For example, a concentration of the p-type impurity contained in the $p^+$-type contact region 5_a_ is lower than the concentration of the p-type impurity contained in the $p^+$-type contact region 4. A concentration of the p-type impurity contained in the $p^+$-type contact region 5_b_ is lower than the concentration of the p-type impurity contained in the $p^+$-type contact region 4. Therefore, it is possible to suppress the $p^+$-type contact regions 5_a_ and 5_b_ from affecting the threshold voltage. For example, it is possible to suppress the threshold voltage from rising. Even when the concentrations of the impurity contained in and the positions of the $p^+$-type contact regions 5_a_ and 5_b_ vary, it is possible to suppress the threshold voltage from varying.

It is possible to form the $p^+$-type contact regions 5_a_ and 5_b_ simultaneously with the $p^+$-type contact regions 4. Specifically, in a case where, when the process illustrated in FIG. 5A is under execution, a width (length in X-direction) of the insulating layer 43_a_ is narrow, the p-type impurity partially diffuses via the insulating layer 43_a_. In other words, the width of the insulating layer 43_a_ corresponds to a size in X-direction of each of the openings OP3. The p-type impurity diffused via the insulating layer 43_a_ forms the $p^+$-type contact regions 5_a_ and 5_b_ respectively being in contact with the insulating layer 43_a_. After that, as the insulating layers 43_a_ are removed to form the upper electrode 20, the $p^+$-type contact regions 5_a_ and 5_b_ respectively being in contact with the first portions 21 and the second portions 22 are formed.

With the method described above, adjusting the width of the insulating layer 43_a_ makes it possible to control widths of and the concentrations of the p-type impurity contained in the $p^+$-type contact regions 5_a_ and 5_b_, respectively. Allowing the p-type impurity to diffuse via the insulating layers 43_a_ makes it possible to suppress the p-type impurity from diffusing to a position adjacent to the insulating layer 31_a_.

(Second Modification

Figure 7:
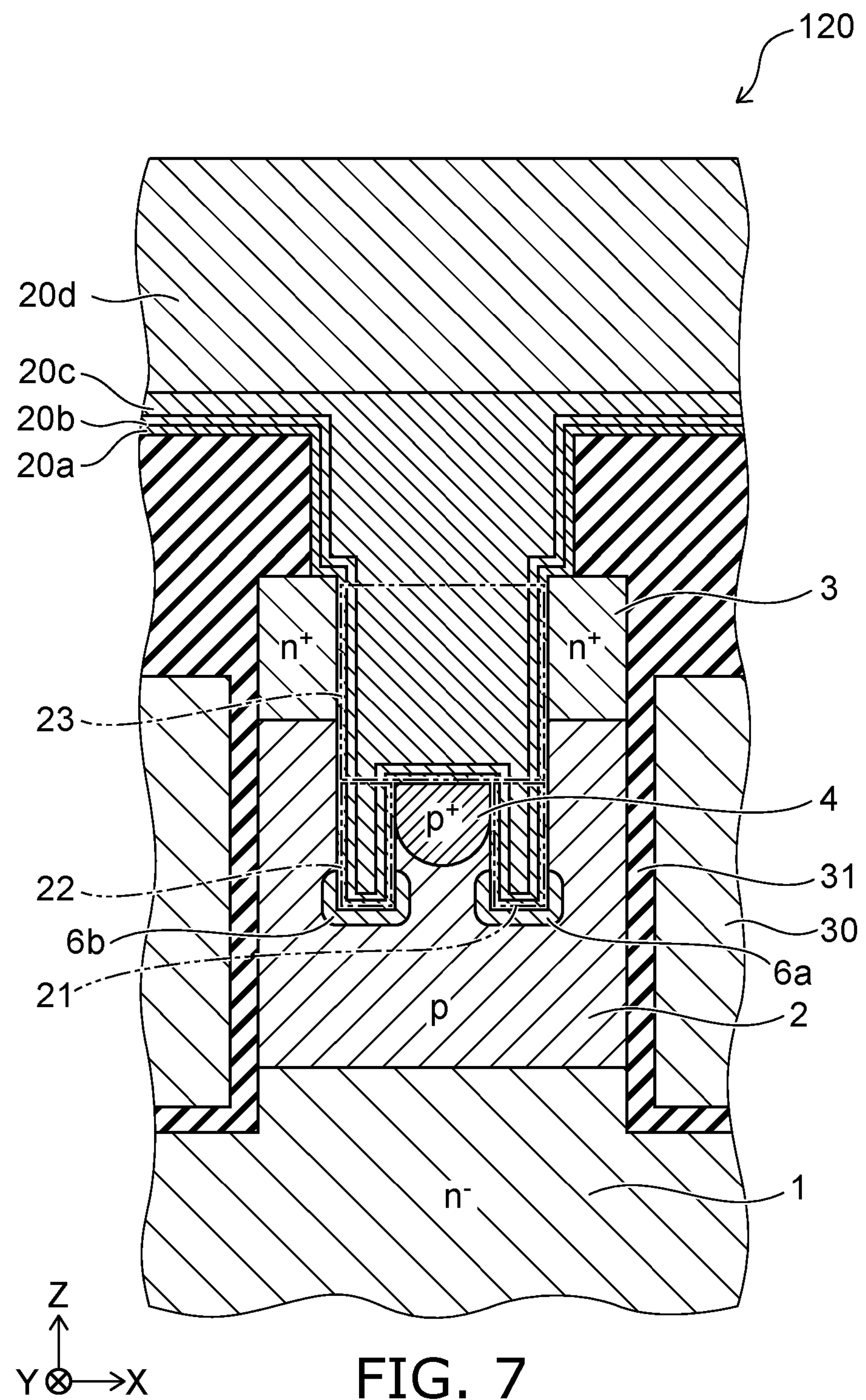
FIG. 7 is a cross-sectional view illustrating one portion of a semiconductor device according to a second modification to the first embodiment.

FIG. 7 is a cross-sectional view illustrating one portion of a semiconductor device according to a second modification to the first embodiment.

A semiconductor device 120 illustrated in FIG. 7 further includes, compared with the semiconductor device 100, a $p^+$-type contact region 6_a_ (sixth semiconductor region) and a $p^+$-type contact region 6_b_.

The $p^+$-type contact region 6_a_ is disposed between a bottom portion of the first portion 21 and the p-type base region 2. The $p^+$-type contact region 6_b_ Is disposed between a bottom portion of the second portion 22 and the p-type base region 2. The $p^+$-type contact regions 6_a_ and 6_b_ are respectively in contact with the first portion 21 and the second portion 22. At least one portion of the $p^+$-type contact region 6_a_ and at least one portion of the $p^+$-type contact region 6_b_ are respectively positioned lower than the $p^+$-type contact region 4. The $p^+$-type contact regions 6_a_ and 6_b_ may be respectively connected to the $p^+$-type contact region 4.

For example, the first portion 21 is positioned in Z-direction between the $p^+$-type contact region 6_a_ and the third portion 23. The second portion 22 is positioned in Z-direction between the $p^+$-type contact region 6_b_ and the third portion 23. The $p^+$-type contact regions 6_a_ and 6_b_ are separated in Z-direction from the $n^-$-type drift region 1.

In a case where the $p^+$-type contact regions 6_a_ and 6_b_ are disposed, holes flowed to the p-type base region 2 when an avalanche breakdown occurs are discharged, via the $p^+$-type contact regions 4, 6_a_, and 6_b_, to the upper electrode 20. The $p^+$-type contact regions 6_a_ and 6_b_ being disposed make it possible to further reduce the electrical resistance against holes.

For example, it is desirable that a concentration of the p-type impurity contained in the $p^+$-type contact region 6_a_ be lower than the concentration of the p-type impurity contained in the $p^+$-type contact region 4. It is desirable that a concentration of the p-type impurity contained in the $p^+$-type contact region 6_b_ be lower than the concentration of the p-type impurity contained in the $p^+$-type contact region 4. A distance in X-direction between the $p^+$-type contact region 6_a_ and the gate insulating layer 31 is shorter than a distance in X-direction between the $p^+$-type contact region 4 and the gate insulating layer 31. A distance in X-direction between the $p^+$-type contact region 6_b_ and the gate insulating layer 31 is shorter than the distance in X-direction between the $p^+$-type contact region 4 and the gate insulating layer 31. Making the concentrations of the p-type impurity contained in the $p^+$-type contact regions 6_a_ and 6_b_, respectively, lower than the concentration of the p-type impurity contained in the $p^+$-type contact region 4 makes it possible to suppress the $p^+$-type contact regions 6_a_ and 6_b_ from affecting the threshold voltage. For example, it is possible to suppress the threshold voltage from rising. Even when the concentrations of the impurity contained in and the positions of the $p^+$-type contact regions 6_a_ and 6_b_ vary, it is possible to suppress the threshold voltage from varying.

The $p^+$-type contact regions 6_a_ and 6_b_ are formed, for example, as illustrated in FIG. 4B, when, at a timing after the openings OP3 are formed and before the insulating layers 43_a_ are formed, the p-type impurity is ion implanted toward bottoms of the openings OP3.

The semiconductor device 120 may further include, similar to the first modification, the $p^+$-type contact regions 5_a_ and 5_b_. Therefore, it is possible to further reduce the electrical resistance against holes when an avalanche breakdown occurs. The $p^+$-type contact regions 6*a* and 6*b* may be respectively connected to the $p^+$-type contact regions 5*a* and 5*b*.

(Third Modification)

Figure 8:
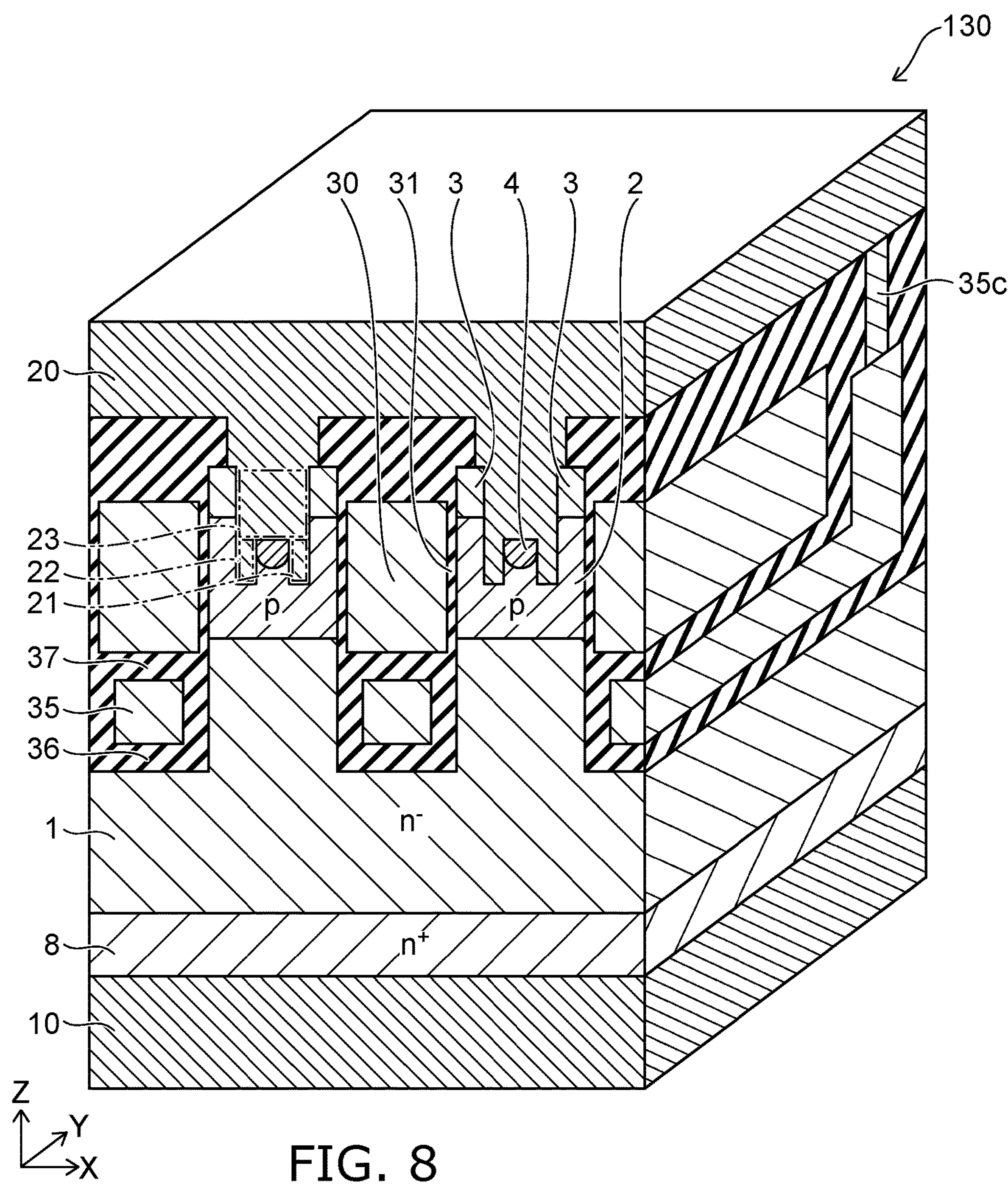
FIG. 8 is a perspective cross-sectional view illustrating a semiconductor device according to a third modification to the first embodiment.

FIG. 8 is a perspective cross-sectional view illustrating a semiconductor device according to a third modification to the first embodiment.

A semiconductor device 130 illustrated in FIG. 8 further includes a conductive part 35, compared with the semiconductor device 100.

The conductive part 35 is disposed in the $n^-$-type drift region 1 via an insulating layer 36. The gate electrode 30 is disposed on the conductive part 35 via an insulating layer 37. The gate electrode 30 is electrically separated from the conductive part 35. The conductive part 35 extends in Y-direction. For example, an end in Y-direction of the conductive part 35 is bent upward, and is electrically connected to the upper electrode 20 via a connecting part 35*c*.

While the semiconductor device 130 is in the off state, a potential difference between the $n^-$-type drift region 1 and the conductive part 35 causes a depletion layer to expand from an interface between the $n^-$-type drift region 1 and the insulating layer 36 toward the $n^-$-type drift region 1. The expanded depletion layer makes it possible to improve the breakdown voltage of the semiconductor device 130. While the breakdown voltage of the semiconductor device 130 is maintained, it is otherwise possible to improve the concentration of the n-type impurity contained in the $n^-$-type drift region 1, reducing an on-resistance of the semiconductor device 130.

The semiconductor device 130 may further include, similar to the first modification, the $p^+$-type contact regions 5*a* and 5*b*. The semiconductor device 130 may otherwise further include, similar to the second modification, the $p^+$-type contact regions 6*a* and 6*b*.

Second Embodiment

Figure 9:
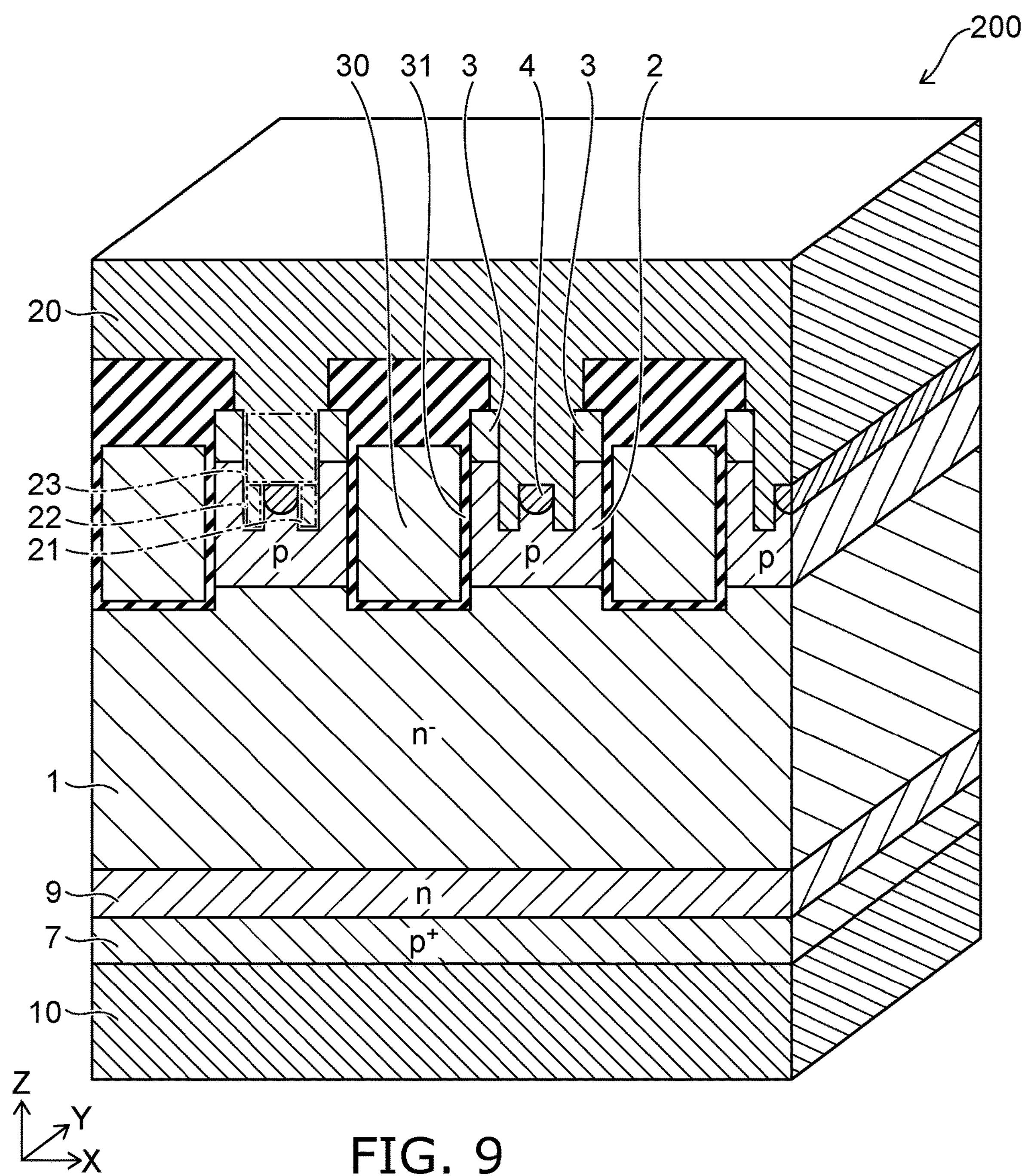
FIG. 9 is a perspective cross-sectional view illustrating a semiconductor device according to a second embodiment.

FIG. 9 is a perspective cross-sectional view illustrating a semiconductor device according to a second embodiment.

A semiconductor device 200 illustrated in FIG. 9 differs from the semiconductor device 100, in that the semiconductor device 200 includes, instead of the $n^+$-type drain region 8, a $p^+$-type collector region 7 (seventh semiconductor region) and an n-type buffer region 9. The semiconductor device 200 is an IGBT.

The $p^+$-type collector region 7 is disposed between the lower electrode 10 and the $n^-$-type drift region 1, and is electrically connected to the lower electrode 10. The n-type buffer region 9 is disposed between the $p^+$-type collector region 7 and the $n^-$-type drift region 1. A concentration of the n-type impurity contained in the n-type buffer region 9 is higher than the concentration of the n-type impurity contained in the $n^-$-type drift region 1.

Operations of the semiconductor device 200 will be described.

In a state where a positive voltage with respect to the upper electrode 20 is applied to the lower electrode 10, a voltage above a threshold is applied to the gate electrode 30. The p-type base region 2 is then formed with a channel (inversion layer). Electrons flow, via the channel and the $n^-$-type drift region 1, to the lower electrode 10. Holes are implanted from the lower electrode 10 to the $n^-$-type drift region 1. Therefore, the semiconductor device 200 becomes the on state. As the electrons and the holes are implanted in the $n^-$-type drift region 1, and a conductivity modulation occurs, the electrical resistance in the semiconductor device 200 significantly lowers. After that, as the voltage applied to the gate electrode 30 lowers below the threshold, the channel in the p-type base region 2 disappears, causing the semiconductor device 200 to become the off state.

As the semiconductor device 200 switches to the off state, the holes accumulated in the $n^-$-type drift region 1 are discharged, via the p-type base region 2 and the $p^+$-type contact region 4, to the upper electrode 20. Therefore, the upper electrode 20 including the first portions 21 to the third portions 23 in the semiconductor device 200 makes it possible to reduce the electrical resistance against holes. With the second embodiment, it is possible, similar to the first embodiment, to improve the avalanche ruggedness of the semiconductor device 200.

The semiconductor device 200 may further include, similar to the first modification to the first embodiment, the $p^+$-type contact regions 5*a* and 5*b*. The semiconductor device 200 may otherwise further include, similar to the second modification to the first embodiment, the $p^+$-type contact regions 6*a* and 6*b*.

Third Embodiment

Figure 10:
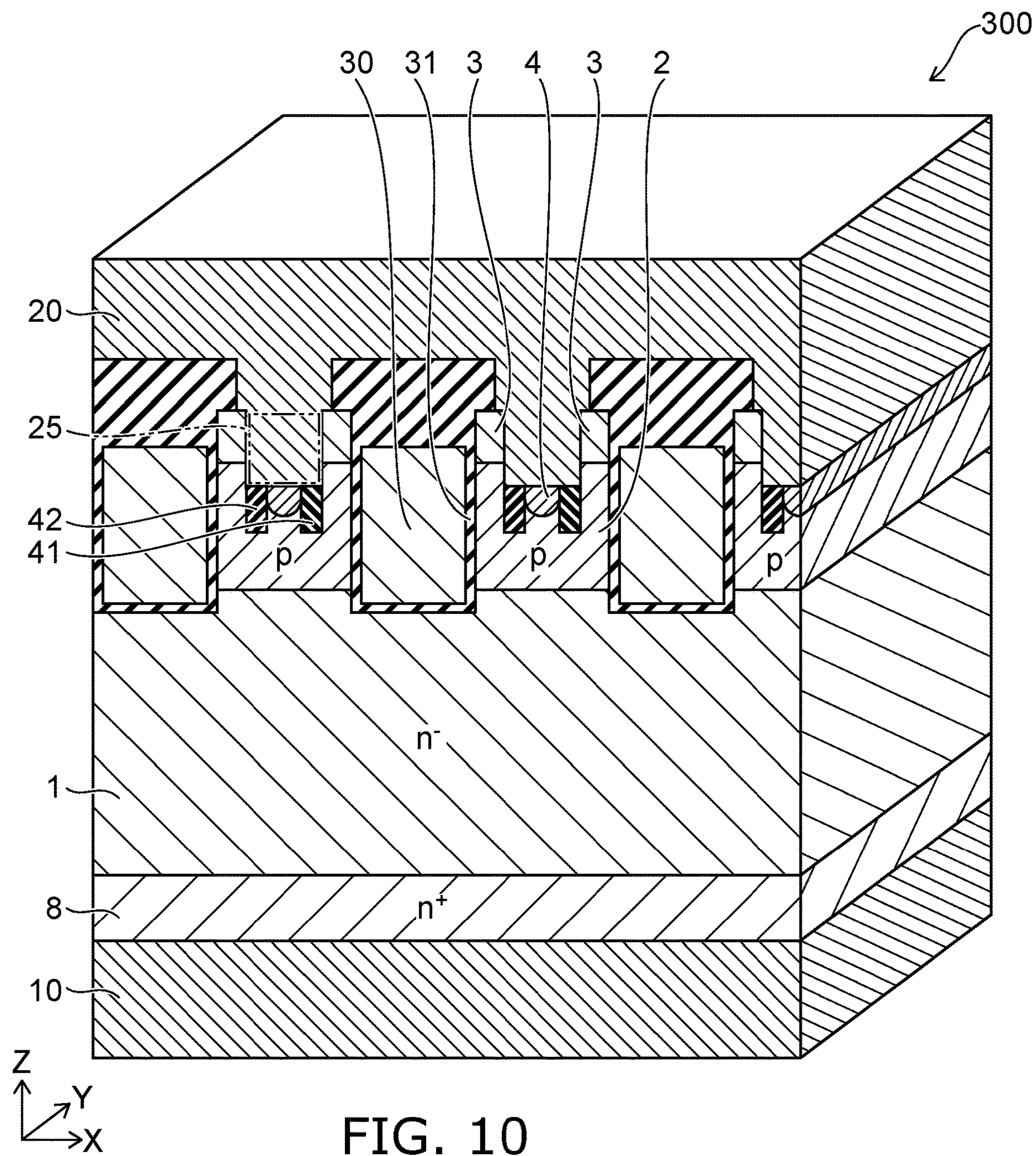
FIG. 10 is a perspective cross-sectional view illustrating a semiconductor device according to a third embodiment.

FIG. 10 is a perspective cross-sectional view illustrating a semiconductor device according to a third embodiment.

A semiconductor device 300 according to the third embodiment differs from the semiconductor device 100, in that the semiconductor device 300 includes, instead of the first portion 21 and the second portion 22, a first insulating part 41 and a second insulating part 42.

The first insulating part 41 and the second insulating part 42 are respectively positioned lower than the $n^+$-type semiconductor region 3, and are separated from each other in X-direction. The $p^+$-type contact region 4 is disposed between the first insulating part 41 and the second insulating part 42. The first insulating part 41 and the second insulating part 42 are each separated in X-direction from the gate insulating layer 31.

The upper electrode 20 includes an electrode portion 25. The electrode portion 25 corresponds to the third portion 23 in the semiconductor device 100. The electrode portion 25 is disposed on the $p^+$-type contact region 4, the first insulating part 41, and the second insulating part 42. The electrode portion 25 is arranged in X-direction with the $n^+$-type semiconductor region 3. The $p^+$-type contact region 4 is in contact with the first insulating part 41, the second insulating part 42, and the electrode portion 25.

For example, a lower end of the first insulating part 41 and a lower end of the second insulating part 42 are separated in Z-direction from the $n^-$-type drift region 1. The lower end of the first insulating part 41 and the lower end of the second insulating part 42 are respectively positioned lower than the lower end of the $p^+$-type contact region 4, and are in contact with the p-type base region 2.

The first insulating part 41 and the second insulating part 42 are formed when, after the process illustrated in FIG. 5A, only one portion of the insulating layer 43*a*, which is positioned above each of the openings OP3, is removed, while the remaining portion of the insulating layer 43*a*, which is positioned in each of the openings OP3, is not removed. After the first insulating part 41 and the second insulating part 42 are formed, the upper electrode 20 is formed, similar to the process illustrated in FIG. 5B.

With the semiconductor device 300, the first insulating parts 41 and the second insulating parts 42 suppress the p-type impurity from diffusing in X-direction, when the $p^+$-type contact regions 4 are to be formed. For example, even when differences occur in positions of the openings OP3, it is possible to suppress the p-type impurity from diffusing to a position adjacent to the gate insulating layer 31. Therefore, it is possible to suppress a threshold voltage from varying per the semiconductor device 300, making the semiconductor device 300 more reliable.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. The above embodiments can be practiced in combination with each other.

What is claimed is:

1. A semiconductor device comprising:

a first electrode;

a first semiconductor region disposed on the first electrode, the first semiconductor region being electrically connected to the first electrode, the first semiconductor region being a first conductivity type;

a second semiconductor region disposed on the first semiconductor region, the second semiconductor region being a second conductivity type;

a third semiconductor region disposed on one portion of the second semiconductor region, the third semiconductor region being the first conductivity type;

a fourth semiconductor region disposed on another portion of the second semiconductor region, the fourth semiconductor region being the second conductivity type, the fourth semiconductor region being positioned below the third semiconductor region, a concentration of a second conductivity type impurity in the fourth semiconductor region being higher than a concentration of the second conductivity type impurity in the second semiconductor region;

a gate electrode being arranged, in a second direction perpendicular to a first direction, via a gate insulating layer, with one portion of the first semiconductor region, the second semiconductor region, and one portion of the third semiconductor region, the first direction being from the first semiconductor region to the second semiconductor region; and a second electrode disposed on the gate electrode, the third semiconductor region, and the fourth semiconductor region, the second electrode being electrically connected to the third semiconductor region and the fourth semiconductor region, the second electrode including a first portion, a second portion, and a third portion, the first portion and the second portion being separated from each other in the second direction, the first portion and the second portion allowing the fourth semiconductor region to be positioned therebetween, the third portion being disposed on the first portion and the second portion, the third portion being arranged in the second direction with the third semiconductor region, the first portion, the second portion, and the third portion being in contact with the fourth semiconductor region.

2. The device according to claim 1, further comprising a fifth semiconductor region being in contact with the first portion, the fifth semiconductor region being the second conductivity type, wherein the fifth semiconductor region contains the second conductivity type impurity at a concentration higher than the concentration of the second conductivity type impurity contained in the second semiconductor region, the fifth semiconductor region is separated from the gate insulating layer, and the first portion is positioned in the second direction between the fourth semiconductor region and the fifth semiconductor region.

3. The device according to claim 2, wherein the concentration of the second conductivity type impurity contained in the fifth semiconductor region is lower than the concentration of the second conductivity type impurity contained in the fourth semiconductor region.

4. The device according to claim 1, wherein a lower end of the first portion and a lower end of the second portion are separated in the first direction from the first semiconductor region, and are in contact with the second semiconductor region.

5. The device according to claim 1, further comprising a sixth semiconductor region disposed between a bottom portion of the first portion and the second semiconductor region, the sixth semiconductor region being the second conductivity type, wherein the sixth semiconductor region contains the second conductivity type impurity at a concentration higher than the concentration of the second conductivity type impurity contained in the second semiconductor region, and the sixth semiconductor region is in contact with the first portion.

6. The device according to claim 1, wherein a ratio of a length in the first direction of the first portion with respect to a length in the second direction of the first portion is greater than 1 and smaller than 20, and a ratio of a length in the first direction of the second portion with respect to a length in the second direction of the second portion is greater than 1 and smaller than 20.

7. The device according to claim 1, wherein a length in the second direction of the first portion and a length in the second direction of the second portion are each shorter than a length in the second direction of the fourth semiconductor region.

8. The device according to claim 1, further comprising a seventh semiconductor region disposed between the first electrode and the first semiconductor region, the seventh semiconductor region being the second conductivity type.

* * * * *